(12) United States Patent
Watanabe et al.

(10) Patent No.: US 7,430,144 B2
(45) Date of Patent: Sep. 30, 2008

(54) SEMICONDUCTOR STORAGE DEVICE

(75) Inventors: Masahiko Watanabe, Nara (JP); Yasumichi Mori, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/589,066

(22) PCT Filed: Feb. 9, 2005

(86) PCT No.: PCT/JP2005/001890

§ 371 (c)(1),
(2), (4) Date: Jun. 1, 2007

(87) PCT Pub. No.: WO2005/076282

PCT Pub. Date: Aug. 18, 2005

(65) Prior Publication Data

US 2007/0230245 A1    Oct. 4, 2007

(30) Foreign Application Priority Data

Feb. 10, 2004    (JP)    ............................. 2004-033915

(51) Int. Cl.
*G11C 7/00* (2006.01)
(52) U.S. Cl. .............. 365/200; 365/185.09; 365/230.03
(58) Field of Classification Search ........................ None
See application file for complete search history.

(56) References Cited

U.S. PATENT DOCUMENTS

| | | | |
|---|---|---|---|
| 5,574,688 A * | 11/1996 | McClure et al. .............. | 365/200 |
| 5,892,713 A | 4/1999 | Jyouno et al. | |
| 6,067,260 A * | 5/2000 | Ooishi et al. ................ | 365/200 |
| 6,122,196 A | 9/2000 | Tanaka et al. | |
| 6,185,137 B1 * | 2/2001 | Sato et al. .................... | 365/200 |
| 6,917,541 B2 | 7/2005 | Shimbayashi et al. | |
| 7,151,704 B2 * | 12/2006 | Arakawa ............... | 365/189.15 |
| 7,272,049 B2 * | 9/2007 | Kang et al. .............. | 365/185.2 |

FOREIGN PATENT DOCUMENTS

JP    53-000032 A    1/1978

(Continued)

OTHER PUBLICATIONS

International Search Report mailed on Jun. 14, 2005 for PCT Application No. PCT/JP2005/001890 filed on Feb. 9, 2005, five pages.

*Primary Examiner*—Tan T. Nguyen
(74) *Attorney, Agent, or Firm*—Morrison & Foerster LLP

(57) ABSTRACT

A semiconductor storage device according to the present invention comprises one or more memory planes 8 comprising a plurality of memory blocks 9, and a block selection circuit for decoding an block address signal for selecting the memory block 9 from the memory plane 8 to select the memory block, generates a dummy block address for selecting a dummy block that is different from the selected block address and a defective block address of a defective block by a predetermined logical operation targeted for a specific partial bit in address bits of the selected block address when the defective block is contained in the memory plane. A bit line connected to the selected memory cell selected by the selected block address and a bit line in the dummy block are connected to differential input terminals of a sense amplifier circuit 9.

10 Claims, 8 Drawing Sheets

FOREIGN PATENT DOCUMENTS

| | | |
|---|---|---|
| JP | 62-226500 A | 10/1987 |
| JP | 08-235878 A | 9/1996 |
| JP | 10-083690 A | 3/1998 |
| JP | 11-191298 A | 7/1999 |
| JP | 2003-77282 A | 3/2003 |

\* cited by examiner

| BA 3 2 1 0 | BSA | BSB Sbbs=0 | BSB Sbbs=1 |
|---|---|---|---|
| 0 0 0 0 | 0 | 1 | 3 |
| 0 0 0 1 | 1 | 0 | 2 |
| 0 0 1 0 | 2 | 3 | 1 |
| 0 0 1 1 | 3 | 2 | 0 |
| 0 1 0 0 | 4 | 5 | 7 |
| 0 1 0 1 | 5 | 4 | 6 |
| 0 1 1 0 | 6 | 7 | 5 |
| 0 1 1 1 | 7 | 6 | 4 |
| 1 0 0 0 | 8 | 9 | 11 |
| 1 0 0 1 | 9 | 8 | 10 |
| 1 0 1 0 | 10 | 11 | 9 |
| 1 0 1 1 | 11 | 10 | 8 |
| 1 1 0 0 | 12 | 13 | 15 |
| 1 1 0 1 | 13 | 12 | 14 |
| 1 1 1 0 | 14 | 15 | 13 |
| 1 1 1 1 | 15 | 14 | 12 |

SEMICONDUCTOR STORAGE DEVICE

CROSS-REFERENCE TO RELATED APPLICATIONS

This application is a National Phase filing under 35 U.S.C. § 371 of International Application No. PCT/JP2005/001890 filed on Feb. 9, 2005, and which claims priority to Japanese Patent Application No. 2004-033915 filed on Feb. 10, 2004.

TECHNICAL FIELD

The present invention relates to a semiconductor storage device and more particularly to a semiconductor storage device constituted such that a memory block in which a plurality of memory cells are arranged in a row direction and column direction in the form of an array, and the memory cells in the same column are connected to a common bit line is formed; one or more memory planes comprising the memory blocks arranged in the column direction are formed; at least two global bit lines extending across the memory planes in the column direction are provided, and each of the global bit lines is connected to one or more bit lines of each memory block through a bit line selection element. Further particularly, it relates to a technique for a reading operation in which a current flowing in a memory cell of a semiconductor storage device is detected and its stored state is determined at high speed.

BACKGROUND ART

In order to read a stored state of a memory cell in a semiconductor storage device, various kinds of methods have been employed. As an example, a flash memory that is a nonvolatile semiconductor storage device will be described. The flash memory comprises a memory transistor in which each memory cell has a floating gate structure, and information is stored according to an amount of electric charge (electrons) injected to the floating gate of each memory cell. More specifically, in a state many electrons are injected in the floating gate, an inversion layer is not likely to be formed in a channel region, so that a threshold voltage of the memory cell becomes high (defined as a programmed state). Meanwhile, in a state the electrons are discharged from the floating gate, the inversion layer is likely to be formed in the channel region, so that the threshold voltage of the memory cell becomes low (defined as an erased state). In order to determine whether the selected memory cell is in the programmed state or the erased state at high speed, a reference memory cell having a threshold voltage intermediate between the programmed state and the erased state is prepared and inputted to a differential input type of sense amplifier circuit.

Here, as shown in FIG. 8, in a semiconductor storage device having a memory plane in which memory blocks having the above described hierarchic bit line structure are arranged in a column direction, when a memory cell to be read (selected memory cell schematically shown by ○ in FIG. 8) is selected from the memory block in the memory plane and its stored data is read by a differential input type of sense amplifier circuit provided adjacent to the memory plane, the selected memory cell is connected to one of two input terminals of the sense amplifier circuit through a selection bit line connected to the selected memory cell in the memory block and a global bit line connected to the selection bit line, and a reference memory cell (schematically shown by ● in FIG. 8) is connected to the other of the input terminals. The stored state (threshold voltage in the case of a flash memory) of the reference memory cell is set so as to have a memory cell current intermediate between the memory cell currents varying depending on the stored state of the selected memory cell.

Furthermore, when load capacity of the two input terminals of the sense amplifier circuit is not equal, a difference in transient current for charging the load capacity is generated in a transient state in which each memory cell current is supplied to the selected memory cell and the reference memory cell through the two input terminals, so that a current difference between the selected memory cell current and the reference memory cell current is not correctly generated as a voltage difference between the two input terminals of the sense amplifier circuit. Since this problem hinders the high-speed reading operation, in order to improve the transient response characteristics at the time of the reading operation, load capacity that is parasitic in the global bit line connected to the two input terminals of the sense amplifier is to be equalized.

For example, as shown in FIG. 3, in a nonvolatile semiconductor storage device disclosed in the following Patent Document 1, another global bit line that is not connected to the selected memory cell (referred to as a "dummy global bit line" occasionally hereinafter) is connected to one input terminal of the sense amplifier circuit for the reference memory cell, one bit line (referred to as a "dummy bit line" occasionally hereinafter) in the memory block (referred to as a "dummy block" occasionally hereinafter) that does not contain the selected memory cell is selected and connected to the dummy global bit line, whereby the load capacity that is parasitic in the global bit lines connected to the two input terminals of the sense amplifier circuit is equalized. According to the above constitution, parasitic capacity of one global bit line and parasitic capacity of one bit line are equally added to each input terminal of the sense amplifier circuit, so that the load capacity can be equalized as a whole. In addition, as the dummy block, the memory block adjacent to the memory block selected in view of the parasitic resistance in the global bit line is selected according to a certain rule in general. FIG. 3 is a schematic circuit diagram showing the memory plane structure shown in FIG. 8 in more detail, and it schematically shows that the selected memory cell and the dummy bit line are selected. In addition, broken lines designate unselected state or inactivated state.

Patent Document 1: Japanese unexamined Patent Publication No. 2003-77282

DISCLOSURE OF THE INVENTION

Problems to be Solved by the Invention

Meanwhile, in a general semiconductor storage device, there is a defective memory cell that does not work normally due to a defect in a semiconductor substrate or a particle during manufacturing steps. When only a perfect component in which all memory cells operate normally is regarded as a non-defective component, the manufacturing yield is lowered. Thus, a method in which redundancy repair is performed for a defective memory cell at the time of testing is employed in general.

A generally used redundancy repair technique includes a method in which a defective row or a defective column containing a defective memory cell in an memory cell array, or a totally defective row or column is replaced with a redundant row or a redundant column that is prepared in some numbers in the vicinity of the memory cell array previously. In this case, a defective row address and a defective column address are stored in defective address storing means, and the stored defective row address and defective column address are compared with an address transmitted from the outside and when they coincide with each other, a redundant row or a redundant column is automatically selected.

Although the row or column repair is an effective repair method when a defective mode is generated by the memory cell unit or in a row direction or a column direction, the row or the column that can be remedied is limited depending on the number of the redundant rows or the redundant columns. Thus, the above repair is not effective in a multi-bit sequential defects (a plurality of defective memory cells become defective sequentially) due to a particle, which is more frequently generated as a manufacturing process is miniaturized.

Thus, there is a block redundancy repair method in which a memory block comprising a certain unit of memory cells is remedied in block. This block redundancy repair method can effectively repair the multi-bit sequential defects due to the particle and the like, so that a manufacturing yield can be improved.

According to the general block redundancy repair, when the memory block containing the selected memory cell is a defective block, in order to implement the normal reading, the defective block is not selected but a redundant memory block replaced at the time of testing is selected and a memory cell having the same address therein is selected. However, as disclosed in Patent Document 1 mentioned above, according to a method in which the global bit line and the dummy bit line are selected for the input terminal of the sense amplifier circuit for the reference memory cell, the defective block could be selected as the dummy block to select the dummy bit line. That is, according to the method in which whether an external block address inputted from the outside is coincide with the block address of the defective block is detected and when it is, the defective block is replaced with the redundant block, since the external block address when the defective block is selected to select the dummy bit line is the block address of the normal memory block, the defective block is not replaced with the redundant block and it is selected as it is. When the defect in the defective block is related to the selected dummy bit line, since its influence is reflected to the input terminal of the sense amplifier circuit for the reference memory cell, a normal reading operation of the normal memory block is hindered, so that the normal memory block becomes the defective block because of the defective block in the same memory plane.

In addition, in a case of a constitution in which a process to prohibit an access to the defective block is always performed at the time of testing or a constitution in which a defective block is always replaced with a redundant block regardless of a value of the external block address, there is a case the dummy block is not selected, so that load capacity between two input terminals of the sense amplifier circuit is not equal. As a result, a transient response characteristic is lowered and the high-speed reading operation is prevented.

The present invention was made in view of the above problems and it is an object of the present invention to provide a semiconductor storage device in which an influence of a defective block in a process of equalizing load capacity between differential input terminals of a sense amplifier circuit is eliminated, and a high-speed and stable reading operation can be implemented.

Means for Solving the Problem

To attain the above object, a semiconductor storage device according to the present invention is characterized as a first aspect in which the device comprises one or more memory planes in which a plurality of memory cells are arranged in a row direction and column direction in the form of an array and the memory cells in the same column are connected to a common bit line to form a memory block and a plurality of the memory blocks are arranged in the column direction, at least two global bit lines extending across the memory planes in the column direction each of which can be connected to one or more of the bit lines of each of the memory blocks through each bit line selection element, and a block selection circuit, at the time of a reading operation, for selecting a selected memory block containing a selected memory cell to be read out by putting one of the bit line selection elements into a conduction state so that the bit line connected to the selected memory cell is connected to the one global bit line and for selecting a memory block other than the selected memory block as a dummy block by putting another one of the bit line selection elements into a conduction state so that one of the bit lines in the other memory block is connected to the other global bit line, wherein when a defective block is contained in one or more of the memory planes, the block selection circuit generates a dummy block address for selecting the dummy block that is different from both of a selected block address of the selected memory block and a defective block address of the defective block by a predetermined logical operation targeted for a specific partial bit of each address bit of the selected block address. Here, when the defective block is contained in the memory plane containing the selected memory block, the block selection circuit may generate the dummy block address for selecting the dummy block that is different from both of the selected block address and the defective block address of the defective block by a predetermined logical operation targeted for the specific partial bits of the address bits of the selected block address.

According to the semiconductor storage device of the present invention comprising the first aspect, when the defective block is contained in the memory plane comprising the selected memory block, since the defective block is surely prevented from being selected as the dummy block, and the memory block other than the defective block and the selected memory block is appropriately selected as the dummy block, the bit line connected to the selected memory cell in the selected memory block is connected one of the two global bit lines and one bit line (dummy bit line) in the dummy block is connected to the other global bit line, so that load capacity of the two global bit lines is equivalent to each other, and when a voltage difference or a current difference of the two global bit lines is differentially sensed, the transient response characteristics due to load capacity difference between the two global bit lines can be prevented from deteriorating. As a result, an influence of the defective block is eliminated and a high-speed and stable reading operation can be implemented.

In addition to the first aspect, the semiconductor storage device according to the present invention is characterized, as a second aspect, in that the device is so constituted that when one of the memory blocks in the memory plane is a defective block, the memory block can be repaired by replacing with a redundant block in block.

In addition, according to the semiconductor storage device of the present invention comprising the second aspect, not only a case where the defective block is selected as the dummy block but also in a case where it is selected as the selected memory block, it is replaced with the redundant block, so that a normal reading operation can be implemented.

Furthermore, the dummy block selection method according to the present invention can be applied to a partial acceptable component in which access to the defective block is only prohibited and the defective block is not replaced with the redundant block and only a part of the region having original memory capacity is used as an effective part to tolerate an existence of the defective block.

In addition to the first or second aspect, the semiconductor storage device according to the present invention is characterized, as a third aspect, in that the block selection circuit performs a first logical operation targeted for one or more of the specific partial bits of the selected block address to generate a dummy block address for selecting the dummy block, and when the dummy block address generated by the first logical operation coincides with the defective block address, performs a second logical operation targeted for another one or more of the specific partial bits of the selected block address to generate the dummy block address. Here, it is preferable that the coincidence between the dummy block address and the defective block address is determined by coincidence between the selected block address and the defective block address targeted for address bits except for one or more of the specific partial bits related to the first logical operation.

In addition to the first or second aspect, the semiconductor storage device of the present invention is characterized, as a fourth aspect, in that the block selection circuit performs a first logical operation targeted for one or more predetermined bits of the specific partial bits of the selected block address, and performs a second logical operation targeted for one or more bits except for the predetermined bits of the specific partial bits of the defective block address, to generate the dummy block address.

According to the semiconductor storage device comprising the third or fourth aspect, when the defective block exists, by performing the first and second logical operations targeted for a part of the memory blocks constituting one memory plane, the defective block address can be differentiated from the dummy block address, so that the defective block is prevented from being selected as the dummy block, and the effect in the first aspect can be provided. In addition, a physical distance of the memory block selected as the dummy block can be maintained within a predetermined range by targeting a part of the memory blocks and appropriately selecting the partial bits to be used, so that a physical distance between the selected bit line and the dummy bit line can be maintained within the predetermined range, whereby an influence of parasitic resistance of the global bit line can be prevented and the transient response characteristics does not deteriorate.

In addition, according to the third aspect, the first logical operation can be an operation for selecting the dummy block when the defective block does not exist, so that the selected bit line and the dummy bit line can be selected from adjacent memory blocks.

Furthermore, according to the fourth aspect, through the second logical operation, a part of the partial bits of the dummy block address is surely different from the corresponding address bit of the defective block address. Regardless of whether the defective block exits or not, that is, when the defective block does not exist, the same process can be performed uniformly using a default defective block without detecting existence of the defective block. Alternatively, even when the defective block exists in a certain memory plane, the same process may be carried out uniformly in a state where a certain memory block is selected regardless of whether the defective block is selected as the dummy block or not.

In addition to the any above aspects, the semiconductor storage device of the present invention is characterized, as a fifth aspect, in that the number of the partial bits is 2, and characterized, as a sixth aspect, in that the logical operations are inverting operations of address bits.

According to the semiconductor storage device comprising the fifth aspect, since the number of a part of the memory blocks that is a target of the first and second logical operations is a minimum of four, the memory block other than the defective block and the selected memory block can be surely selected as the dummy block, and by appropriately selecting the partial bit to be used, a distance between the dummy block and the selected memory block can be limited to a distance up to two memory blocks, so that an influence of parasitic resistance of the global bit line can be prevented, and transient response characteristics can be prevented from deteriorating.

According to the semiconductor storage device of the present invention comprising the sixth aspect, since the first and second logical operation can be implemented by extremely simple logical operations, so that the effect of the first aspect can be provided by a simple circuit constitution.

In addition to any one of the above aspects, the semiconductor storage device according to the present invention is characterized, as a seventh aspect, in that a plurality of memory blocks selected by combination of the specific partial bits of the block address to select the memory block are sequentially adjacent to each other to form a sub-memory plane.

According to the semiconductor storage device of the present invention comprising the seventh aspect, since a distance between the dummy block and the selected memory block is prevented from being unnecessarily increased, an influence of the parasitic resistance of the global bit line can be prevented and the transient response characteristics can be prevented from deteriorating.

In addition to any one of the above aspect, the semiconductor storage device according to the present invention is characterized, as an eighth aspect, by comprising a reference circuit and a differential input type of sensing circuit, in which the one global bit line connected to the bit line in the selected memory block is connected to one input of the sensing circuit directly or through a global bit line selection element, the other global bit line connected to the bit line in the dummy block is connected to the other input of the sensing circuit directly or through a global bit line selection element, and the reference circuit has a reference memory cell selectively connected to one of the inputs of the sensing circuit or one of the pair of global bit lines, and at the time of a reading operation, the reference memory cell is connected to the input of the sensing circuit for the dummy block.

According to the semiconductor storage device of the present invention comprising the eighth aspect, there can be provided a semiconductor storage device that can implement the reading operation such that the effect of the first and the other aspects can be implemented concretely.

BRIEF DESCRIPTION OF DRAWINGS

FIG. 5 is a truth table showing logical operations of the main block decoder and the sub-block decoder of the semiconductor storage device according to one embodiment of the present invention;

EXPLANATION OF REFERENCES

1: Semiconductor Storage Device according to the present invention
2: Main Memory Array
2a: Memory Array Body Part
3: Reference Circuit
4: Row Decoder
5: Column Decoder
6: Bias Voltage Application Circuit
7: Sense Amplifier Circuit
8: Memory Plane
9: Memory Block
10: Bit Line Selection Element
11: Global Bit Line Selection Element
12: Block Selection Element
13: Local Column Decoder
14: Global Column Decoder
15: Main Block Decoder
16: Sub-block Decoder
17: Defective Block Detection Circuit
18: Defective Block Address Recording Circuit
19: Address Translation Circuit
20: Plane Decoder Circuit
GBL: Global Bit Line
LBL: Bit Line
WL: Word Line
BA0 to 3: Block Address
BSA0 to 3: Block Selection Signal
BSB0 to 3: Block Selection Signal
Sbbd: Defective Block Detection Signal
PSEL0 to 7: Plane Selection Signal

BEST MODE FOR CARRYING OUT THE INVENTION

A semiconductor storage device according to the present invention (referred to as a "device of the present invention" occasionally hereinafter) will be described with reference to the drawings.

Figure 1:
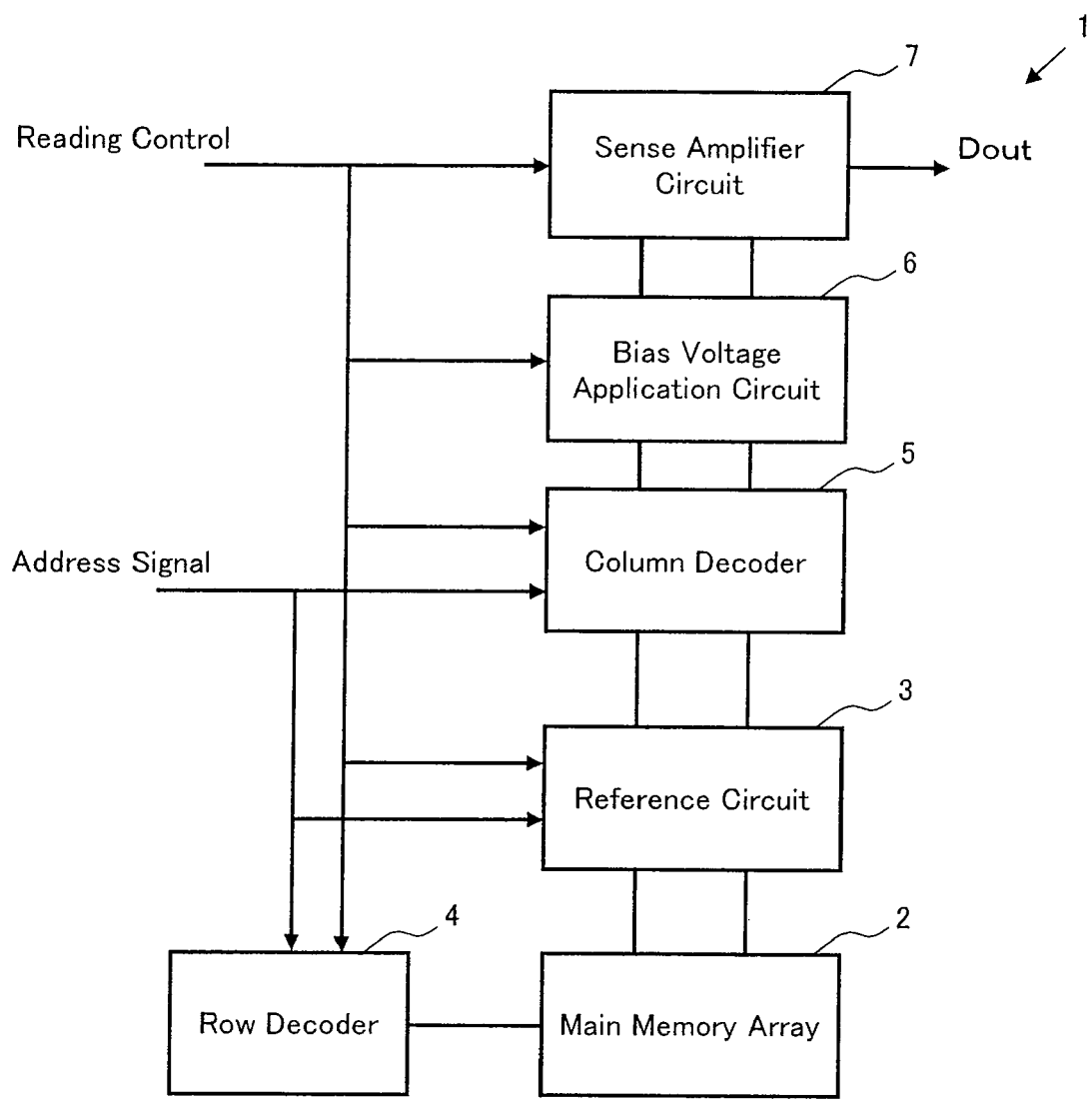
FIG. 1 is a block diagram showing a schematic constitution of a semiconductor storage device according to one embodiment of the present invention.

As shown in FIG. 1, the device 1 of the present invention comprises a main memory array 2, a reference circuit 3, a row decoder 4, a column decoder 5, a bias voltage application circuit 6, a sense amplifier 7 and the like. In addition, a required address signal and reading control signals (a chip enable signal, an output enable signal and the like) are supplied to each component through each input circuit although they are not shown. In addition, an output Dout of the sense amplifier 7 is outputted to the outside through a predetermined output circuit.

Figure 2:
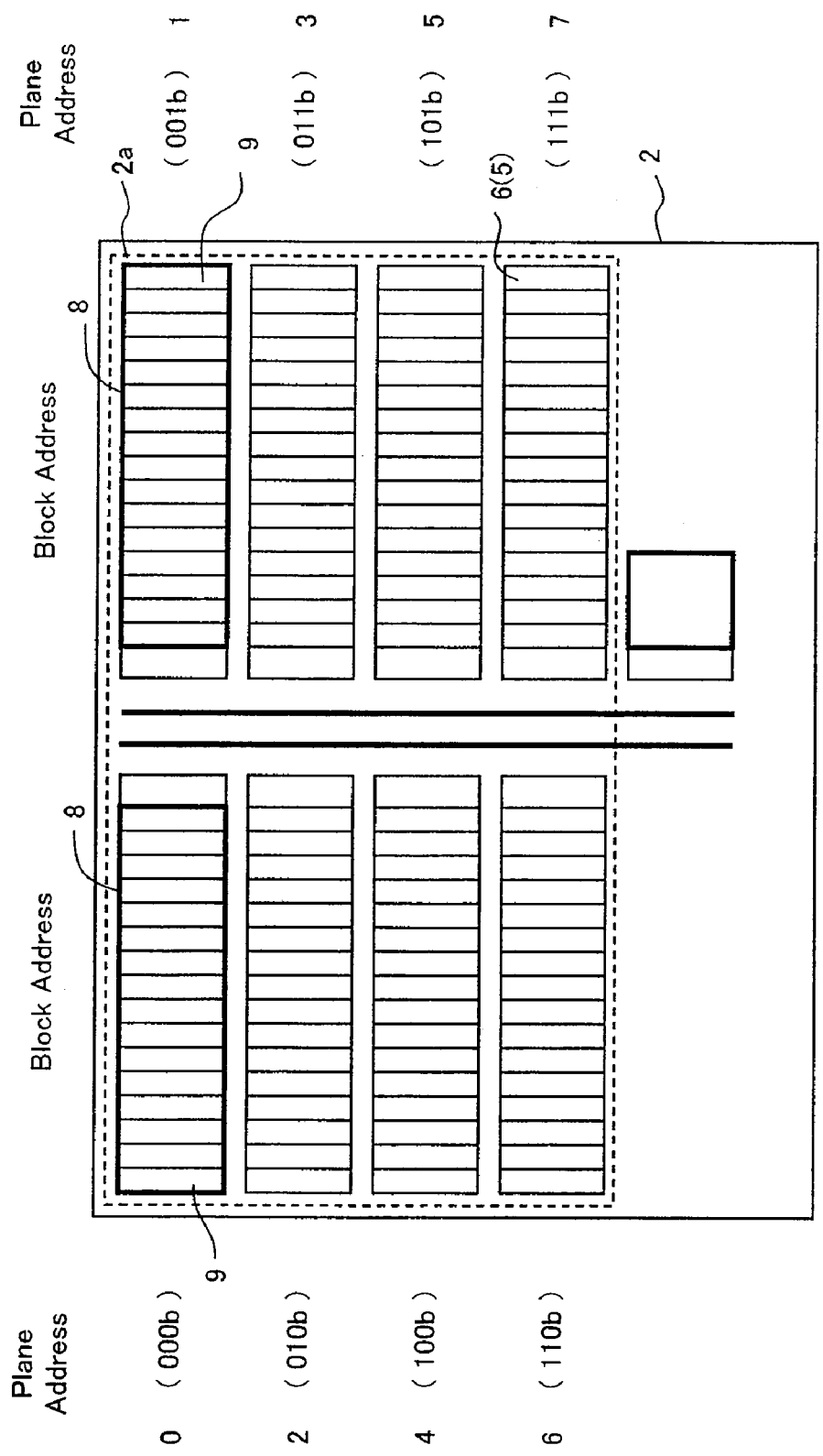
FIG. 2 is a block diagram schematically showing a memory array constitution of the semiconductor storage device according to one embodiment of the present invention.

As shown in FIG. 2, the main memory array 2 comprises a plurality of memory planes 8, for example. Each memory plane 8 comprises a plurality of memory blocks 9 arranged in the column direction and comprising a plurality of memory cells in a row direction and column direction in the form of an array. According to this embodiment, it is assumed that as a memory cell, a flash memory cell comprising a flash memory transistor having a structure of a floating gate type of FET is provided. Therefore, the stored state of the memory cell is set by the number of electrons stored in the floating gate, and its stored state appears as a difference in threshold voltage of the memory transistor.

Figure 3:
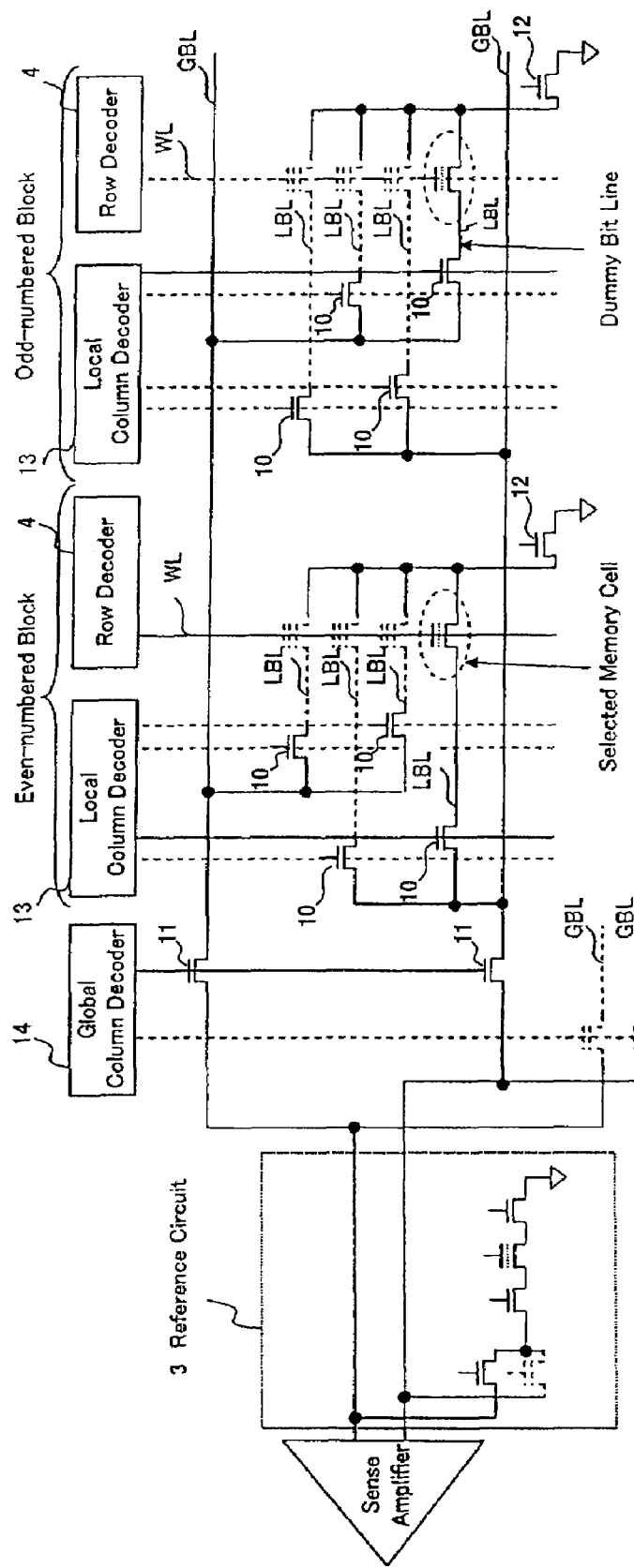
FIG. 3 is a schematic circuit diagram showing an example of a memory plane structure of the semiconductor storage device according to one embodiment of the present invention.

As shown in FIG. 3, in each memory block 9, a drain terminal of each memory cell in the same column is connected to a common bit line LBL, and a gate terminal of each memory cell in the same row is connected to a common word line WL, so that any memory cell can be selected by a selection of the bit line LBL and the word line WL. Furthermore, at least one pair (two pairs in FIG. 3) of global bit line GBL extending across the memory planes 8 in the column direction is provided, and each global bit line GBL can be connected to one or more columns of bit lines LBL (two columns in FIG. 3) in each memory block 9 through each bit line selection element 10. That is, there is employed a hierarchical bit line structure. More specifically, the bit lines LBL of even-numbered columns of the even-numbered memory block 9 and odd-numbered columns of the odd-numbered memory block 9 are connected to one global bit line GBL, and the bit lines LBL of odd-numbered columns of the even-numbered memory block 9 and even-numbered columns of the odd-numbered memory block 9 are connected to the other global bit line GBL. In addition, one pair of global bit lines GBL is selectively connected to the bias voltage application circuit 6 and the sense amplifier circuit 7 through a global bit line selection element 11. In addition, each memory cell in the same memory block is connected to the same source line through a block selection element 12 and it can be erased in block.

Furthermore, according to the block constitution shown in FIG. 2, since the number of memory planes in a memory array body part 2a in the main memory array 2 is 8 and the number of memory blocks in each memory plane 8 is 16, the total number of the memory blocks is 128, so that a block address to select one memory block 9 from the memory array body part 2a consists of 7 bits. In the address bit, high-order three bits are defined as a plane address for selecting the memory plane, and low-order four bits are defined as a block address for selecting one of the 16 memory blocks 9 in each memory plane 8. The low-order 4-bit block address is referred to as the block address hereinafter unless otherwise designated. In addition, the above number of the memory planes in the memory array body part 2a and the above number of blocks in each memory plane 8 are only one example, and the present invention is not limited to the example in FIG. 2. Although only one memory cell is connected to each bit line LBL in the memory block 9 for simplification in FIG. 3, a plurality of memory cells are connected to one bit line LBL in parallel, which constitutes a so-called NOR type memory cell array. In addition, the column direction in FIGS. 2 and 3 is the lateral direction in the drawings.

The reference circuit 3 comprises reference memory cells consisting of flash memory cells having the same structure of the memory cell of the main memory array 2. In the case of a two-valued memory, the threshold voltage of the memory cell of the main memory array 2 is set to a high-threshold voltage or a low-threshold voltage according to whether data is 0 or 1 by a predetermined flash memory write circuit, and the data is written. Therefore, although a memory cell current of the main memory array 2 varies depending on the high or low threshold voltage, a threshold voltage of the reference memory cell is adjusted at the time of testing so as to be a memory cell current intermediate between the two memory cell currents depending on whether the data is 0 or 1.

The row decoder 4 selects the memory cells in the main memory array 2 along the row direction and the column decoder 5 selects the memory cells in the main memory array 2 along the column direction according to the address signal inputted from the outside, and those are circuits for selecting the memory cell from the main memory array 2 to be read out. Hereinafter, the memory cell selected for the reading operation is referred to as the selected memory cell.

More specifically, a part or an entire part of the row decoder 4 and the column decoder 5 are provided for each memory plane 8. Referring to FIG. 3, in the selected memory block containing the selected memory cell, the row decoder 4 selects the word line WL connected to the selected memory cell and this selected word line is driven to a predetermined selection level. In addition, the column decoder 5 comprises a local column decoder 13 for selecting the bit line selection element 10 and a global column decoder 14 for selecting the global bit line selection element 11. According to this embodiment, the memory blocks 9 are arranged in the column direction and a block decoder for selecting one memory block 9 in the memory plane 8 caries out an operation corresponding to one kind of row decoding operation. Although the block decoder therefore constitutes a part of the row decoder 4, that block decoder is treated independently in this embodiment. In addition, although a plane decoder for selecting one memory plane 8 from the main memory array 2 also constitutes a part of the column decoder 5, that plane decoder is treated independently in this embodiment.

The bias voltage application circuit 6 applies a predetermined bias voltage to supply a memory cell current to the selected memory cell and the reference memory cell through one global bit line GBL selected by the global column decoder 14. The bias voltage application circuit 6 converts a current difference generated due to a difference in set threshold voltage of each memory cell of the memory cell current supplied to the selected memory cell and the reference memory cell, to a voltage difference, and transmits it to the next-stage sense amplifier circuit 7. In addition, as for the bias voltage application circuit 6, various kinds of circuit constitutions have been proposed and one of the well-known circuit constitution is used in this embodiment, so that a detailed description for the circuit constitution is not repeated.

In this embodiment, the sense amplifier circuit 7 uses a differential input type of sense amplifier, differentially amplifies a voltage difference transmitted from the bias voltage application circuit 6 to detect the threshold voltage of the selected memory cell and reads out its stored data. Since various kinds of differential input type of sense amplifiers have been used practically and one well-known circuit constitution is used in this embodiment, a detailed description of the circuit constitution will not be repeated.

Next, a description will be made of a block decoder for separately selecting the selected memory block and a dummy block from the memory plane 8, which is a characteristic part of the device 1 of the present invention. In addition, the selected memory block is the memory block 9 containing the selected memory cell and the dummy block is a memory block 9 selected by the block decoder according to the present invention from the memory blocks 9 other than the selected memory block in the same memory plane 8. In the following description, an example in which the memory plane 8 comprises 16 memory blocks 9 will be illustrated.

Figure 4:
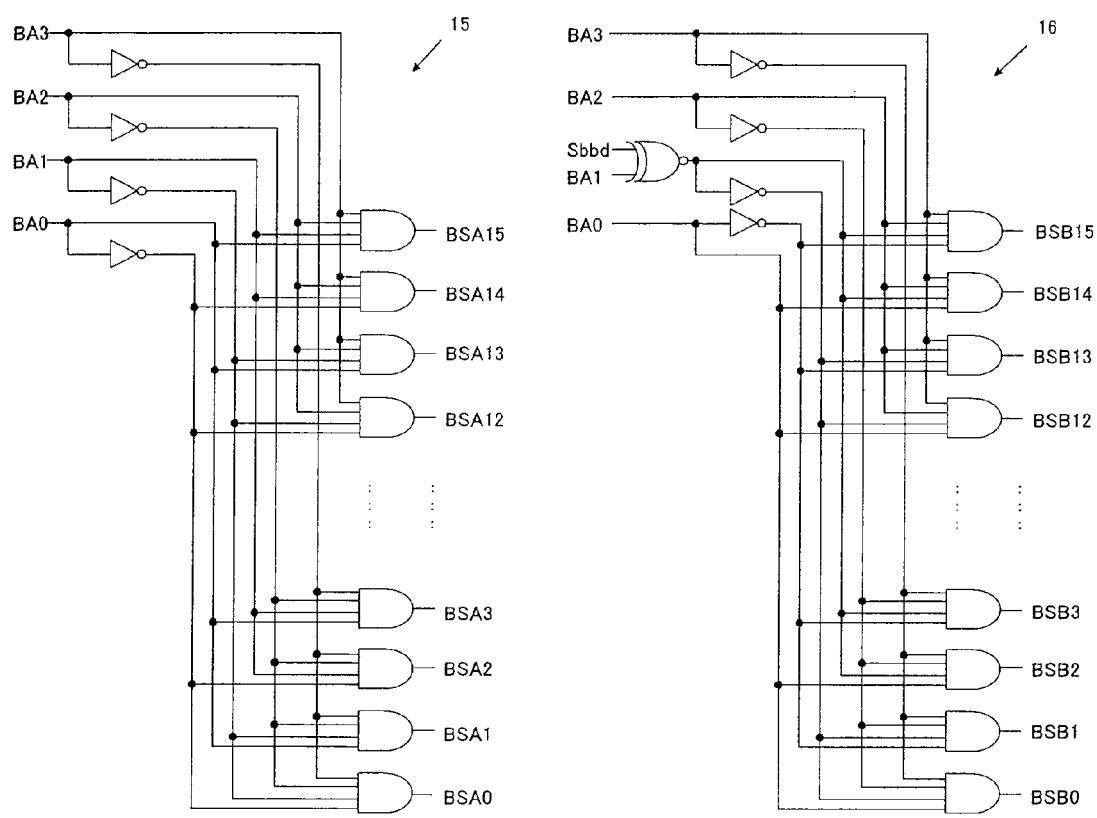
FIG. 4 is a circuit diagram showing an example of a circuit constitution of a main block decoder and a sub-block decoder of the semiconductor storage device according to one embodiment of the present invention.

FIG. 4 shows a main block decoder 15 for selecting the selected memory block, and a sub-block decoders 16 for selecting the dummy block. To each of the block decoders 15 and 16, 4 bits BA0 to 3 of the block addresses are inputted and 16 kinds of block selection signals BSA0 to 15 and BSB0 to 15 are generated. Each of the block decoder 15 and 16 comprises 16 AND circuits. The block decoder 15 is different from the block decoder 16 in that low-order 2 bits BA0 and 1 are inputted differently. The block address BA0 to 3 are inputted to the main block decoder 15 so that its input and output relation becomes as shown in a truth table in FIG. 5. Meanwhile, according to the least significant bit BA0 in the sub-block decoder 16, its signal level is inverted from that of the main block decoder 15 and inputted. According to the second low-order bit BA1, an exclusive OR process is performed with a defective block detection signal Sbbd and inputted. According to the high-order two bits, they are inputted in the same way of that of the main block decoder 15. In addition, a inverting operation of the signal level contains an operation to switch an input between a certain signal and its negative logic signal.

Figure 6:
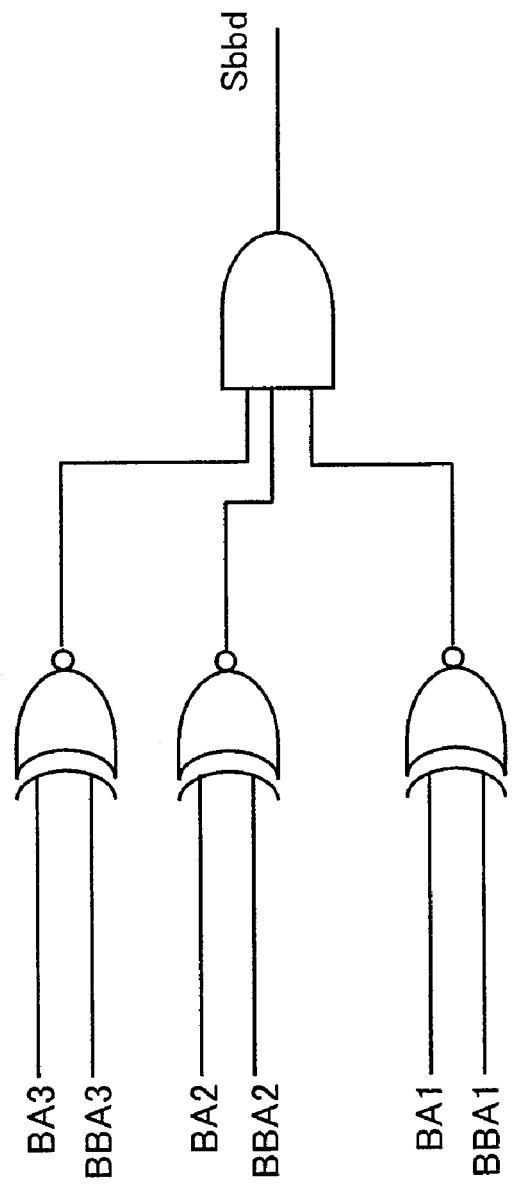
FIG. 6 is a circuit diagram showing an example of a defective block detection circuit of the semiconductor storage device according to one embodiment of the present invention.

The defective block detection signal Sbbd is outputted from a defective block detection circuit 17 for detecting coincidence between the high-order 3 bits BA1 to 3 of the block address inputted to the main block decoder 15 and high-order 3 bits BBA0 to 3 of the defective block address as shown in FIG. 6, and when the coincidence is detected, a high level is outputted. In addition, since the defective block address is needed at the time of a replacement process in which the defective block is replaced with a redundant block, an address stored in a defective block address recording circuit 18 (refer to FIG. 7) is used. Although the defective block address is a block address of the defective block, when there is no defective block, for example, the most significant address "1 1 1 1" is allotted to it as a default state. According to the above constitution, when the defective block exists, the defective block detection signal Sbbd becomes high level and in the above exclusive OR process, the second low-order bit BA1 is inverted and inputted to the sub-block decoder 16. FIG. 5 shows relations between the block address BA0 to 3 and the block selection signals BSB0 to 15 in both cases where the defective block is detected and not detected.

For example, in a case where the selected memory cell is in the memory block having a block address "0 1 1 0" and the defective block address of the defective block is "0 1 1 1", when the block address "0 1 1 0" is inputted to the main block decoder 15 in order to select the selected memory block, a memory block corresponding to the block selection signal BSA6 is selected. Meanwhile, since high-order 3 bits of the block address "0 1 1 0" inputted to the main block decoder 15 and the defective block address "0 1 1 1" are the same, the defective block is detected. Here, if the defective block is not detected, the defective block corresponding to the block selection signal BSB7 may be selected as a dummy block. However, since the defective block is detected and the defective block detection signal Sbbd becomes high level, the memory block corresponding to the block selection signal BSB5 is selected as the dummy block and the defective block is not selected.

Next, how to use the block selection signals BSA0 to 15 and BSB0 to 15 will be briefly described. The block selection signals BSA0 to 15 are used to select the selected memory block. More specifically, they are inputted to the local column decoder 13 and the row decoder 4 of the selected memory block. The selected local column decoder 13 activates one bit line selection element 10 of the selected memory block and selects a bit line connected to the selected memory cell and connects it to one global bit line GBL. In addition, the selected row decoder 4 drives one word line WL to the selection level and selects the memory cell connected to that selected word line. The block selection signal BSB0 to 15 are used to select the dummy block. More specifically, they are inputted to the local column decoder 13 of the dummy block. The block selection signal BSB0 to 15 are not inputted to the row decoder 4, so that the word lines WL of the dummy block are all in unselected state. That is, in the dummy block, the dummy bit line selected by the local column decoder 13 of the dummy block is only connected to the other global bit line GBL.

By the operations described above, the selected memory cell is connected to the bias voltage application circuit 6 and the sense amplifier circuit 7 through one of the pair of global bit lines GBL selected by the global column decoder 14, and the bit line LBL in the selected memory block connected thereto. Meanwhile, one dummy bit line in the dummy block selected by the sub-block decoder 16 is connected to the other side of the pair of global bit lines GBL selected by the global column decoder 14, and parasitic capacity of one bit line is equally added to each of the pair of global bit lines GBL selected by the global column decoder 14, so that load capacity is equalized. In addition, the reference memory cell is selected for the global bit line GBL connected to the dummy bit line. Thus, the memory cell current is supplied to the selected memory cell and the reference memory cell from the bias voltage application circuit 6, and a memory cell current difference generated by a difference in threshold voltage set in both memory cells is converted to a voltage difference and the voltage difference is amplified by the sense amplifier circuit 7 to be detected.

As described above, according to the device 1 of the present invention, even when the defective block is contained in the memory plane containing the selected memory cell, the defective block is prevented from being selected as the dummy block, and the bit line in the dummy block other than the defective block is selected as the dummy bit line and its parasitic capacity can be added to the global bit line. As a result, total load capacity can be equalized with the global bit line of the selected memory cell, so that a reading operation that is superior in transient response characteristics and stability can be implemented at high speed. Furthermore, as can be clear from the truth table in FIG. 5, even when the number of memory blocks in the memory plane is increased from 16 to 32, 64 and 128, since a logical distance between the selected memory block and the dummy block is up to 2 bits, a physical distance between the selected memory block and the dummy block is equal to that of two memory blocks at most, so that an influence of parasitic resistance of the global bit line can be prevented.

Figure 7:
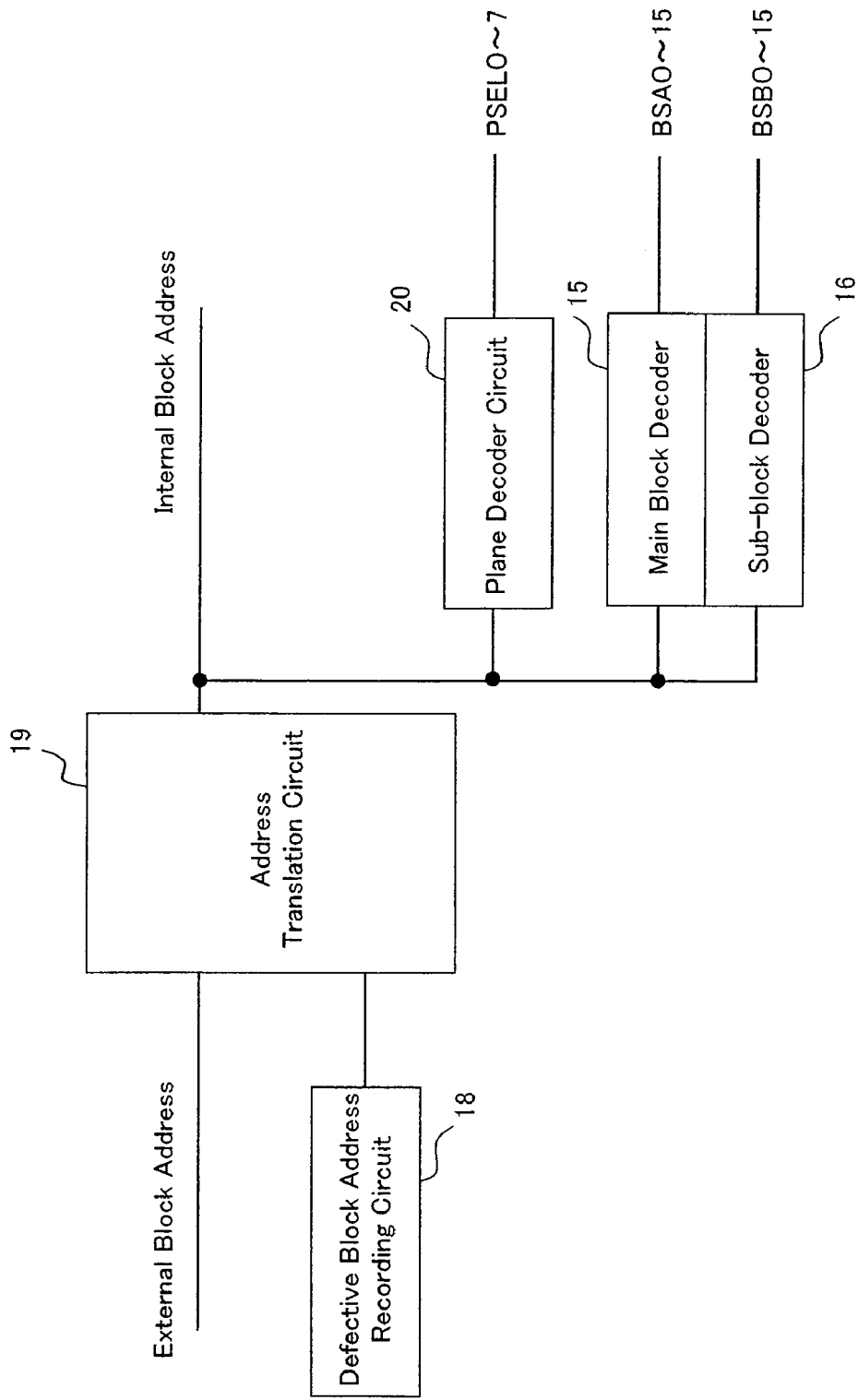
FIG. 7 is a circuit diagram showing an example of a circuit constitution to replace a defective block with a redundant block in the semiconductor storage device according to the present invention.
Figure 8:
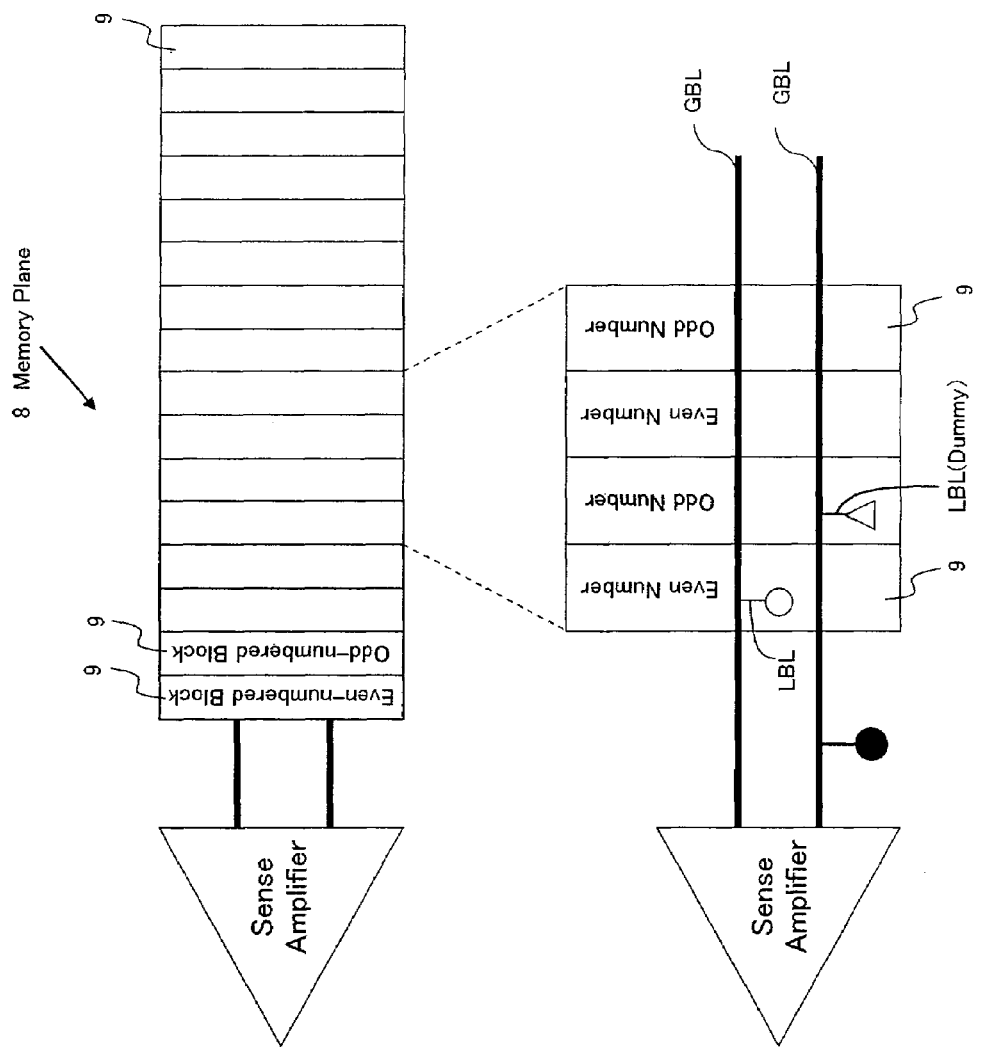
FIG. 8 is a view to explain an example of a positional relation between a selected memory block and a dummy block in a conventional semiconductor storage device.

Next, a description will be made of steps and circuit constitution of a so-called block redundancy repair in which a defective block is replaced with a redundant block. As shown in FIG. 7, an external block address (3-bit plane address and 4-bit block address) is inputted from the outside to an address translation circuit 19. The address translation circuit 19 converts the inputted external block address into an internal block address by inverting address bits of the inputted external block address corresponding to a dissident part between the 7-bit defective block address outputted from a defective block address recording circuit 18 in which a state (1 or 0) of each address bit of the defective block address is stored, and a redundant block address ("1 1 1 1 1 1 1", for example) and outputs the internal block address.

In the internal block address converted by the address translation circuit 19, high-order three bits of the plane address are inputted to the plane decoder circuit 20 and eight plane selection signals PSEL0 to 7 are outputted. One of the plane selection signals PSEL0 to 7 outputs a predetermined selection level (high level, for example) according to a value of the plane address, and the other seven signals output unselection level (low level, for example). Low-order four bits of the block address of the internal block address are inputted to the main block decoder 15 and the sub-block decoder 16, and the block selection signals BSA0 to 15 and BSB0 to 15 are outputted.

According to the above circuit constitution, since both of the plane address and the block address inputted from the outside are converted by the address translation circuit 19, all memory blocks in the same memory plane can be translated to another memory plane at the same time. Therefore, as shown in FIG. 7, when the internal block address is inputted to the plane decoder circuit 20, the high-order 3 bits BA1 to 3 of the block address to be inputted to the defective block detection circuit 17 shown in FIG. 6 needs to be partial bits of the external block address. When the converted internal block address is used, it is necessary to use the converted defective block address. However, according to the circuit constitution shown in FIG. 7, since the converted defective block address is the redundant block address, it is not necessary to provide a defective block address recording circuit 18 for the defective block detection circuit 17.

Another embodiment of the device 1 of the present invention will be described hereinafter.

(1) Although each of the main block decoder 15 and the sub-block decoder 16 is a one-stage decoder in the above embodiment, each of them may be a two-stage decoder consisting of a pre-decoder and a main decoder. For example, the main block decoder 15 may comprise a pre-decoder for low-order 2 bits and a pre-decoder for high-order 2 bits and a main decoder for decoding a pre-decoded signal of each pre-decoder, and the sub-block decoder 16 may comprise a pre-decoder for low-order 2 bits and a pre-decoder for high-order 2 bits and a main decoder for decoding a pre-decoded signal of each pre-decoder. Here, when it is assumed that the relation in the truth table shown in FIG. 5 is maintained, the main block decoder 15 and the sub-block decoder 16 can use the pre-decoder for the high-order 2 bits in common.

(2) Although the logical operation for the second low-order bit BA1 of the block address inputted to the sub-block decoder 16 is such that when the high-order 3 bits BA1 to 3 of the block address coincide with the high-order 3 bits BBA0 to 3 of the defective block address, a inverting process is performed in the above embodiment, the second low-order bit BBA1 of the defective block address may be inverted instead of the second low-order bit BA1 of the block address and inputted without performing the above coincidence determination.

(3) In addition, in the above embodiment and the above another embodiment, relations between the low-order 2 bits BA0 and BA1 of the block address inputted to the sub-block decoder 16 may be exchanged.

(4) According to the above embodiment, since the defective block detection circuit 17 has the circuit constitution in which the coincidence between the high-order 3 bits BA1 to 3 of the block address and the high-order 3 bits BBA0 to 3 of the defective block address is detected, even when the defective block exists in another memory plane, there is a case where the defective block is detected. However, even in this case, there is no inconvenience even when the second low-order bit BA1 is inverted. In addition, in order to detect only a case where the defective block exists in the memory plane to which the selected memory block belongs, it is necessary to input the plane address and a defective plane address of the defective block to the defective block detection circuit 17.

(5) Although the block decoder comprises the main block decoder 15 for selecting the selected memory block, and the sub-block decoder 16 for selecting the dummy block in the above embodiment, the constitution of the block decoder is not limited to the above. For example, it may comprise a first block decoder for generating block selection signals for selecting the local column decoders 13 of the selected memory block and the dummy block, and a second block decoder for generating a block selection signal for selecting the row decoder 4 of the selected memory block. In this case, one of the block selection signals outputted from the first block decoder selects the local column decoder 13 of the selected memory block, and the other signal selects the local column decoder 13 of the dummy block. Therefore, the first block decoder is so constituted that it always outputs the block selection signals having two selected states. In addition, the second block decoder has the same circuit constitution as that of the main block decoder in the above embodiment.

(6) Although it is assumed that the defective block is treated by the redundancy repair in the above embodiment, the method for eliminating the defective block according to the device of the present invention can be effective for a semiconductor storage device in which access to the defective block is just prohibited and an external address is translated such that it becomes an address of the sequential non-defective blocks.

(7) Although the flash cell is assumed as the memory cell in the above embodiment, the memory cell is not limited to this. In addition, the block replacement process according to the present invention can be applied to a variable resistance element type of memory cell such as a MRAM, an OUM, a RRAM other than the one in which a difference of a stored state appears as a difference in threshold voltage of a memory transistor. Furthermore, the method for eliminating the defective block by the device of the present invention can be applied to another semiconductor storage device.

INDUSTRIAL APPLICABILITY

The semiconductor storage device according to the present invention can be applied to a high-performance semiconductor storage device in which a high-speed and stable reading operation can be implemented.

The invention claimed is:

1. A semiconductor storage device comprising:
one or more memory planes in which a plurality of memory cells are arranged in a row direction and column direction in the form of an array and the memory cells in the same column are connected to a common bit line to form a memory block, and a plurality of the memory blocks are arranged in the column direction;
at least two global bit lines extending across the memory planes in the column direction each of which can be connected to one or more of the bit lines of each of the memory blocks through each bit line selection element; and
a block selection circuit, at the time of a reading operation, for selecting a selected memory block containing a selected memory cell to be read out by putting one of the bit line selection elements into a conduction state so that the bit line connected to the selected memory cell is connected to the one global bit line and for selecting a memory block other than the selected memory block as a dummy block by putting another one of the bit line selection elements into a conduction state so that one of the bit lines in the other memory block is connected to the other global bit line, wherein
when a defective block is contained in one or more of the memory planes, the block selection circuit generates a dummy block address for selecting the dummy block that is different from both of a selected block address of the selected memory block and a defective block address of the defective block by a predetermined logical operation targeted for a specific partial bit of each address bit of the selected block address.

2. A semiconductor storage device comprising:
one or more memory planes in which a plurality of memory cells are arranged in a row direction and column direction in the form of an array and the memory cells in the same column are connected to a common bit line to form a memory block, and a plurality of the memory blocks are arranged in the column direction;
at least two global bit lines extending across the memory planes in the column direction each of which can be connected to one or more of the bit lines of each of the memory blocks through each bit line selection element; and
a block selection circuit, at the time of a reading operation, for selecting a selected memory block containing a selected memory cell to be read out by putting one of the bit line selection elements into a conduction state so that the bit line connected to the selected memory cell is connected to the one global bit line and for selecting a memory block other than the selected memory block as a dummy block by putting another one of the bit line selection elements into a conduction state so that one of the bit lines in the other memory block is connected to the other global bit line, wherein
when a defective block is contained in the memory plane containing the selected memory block, the block selection circuit generates a dummy block address for selecting the dummy block that is different from both of a selected block address of the selected memory block and a defective block address of the defective block by a predetermined logical operation targeted for a specific partial bit of each address bit of the selected block address.

3. The semiconductor storage device according to claims 1 or 2, wherein the device is so constituted that, when one of the memory blocks in the memory plane is a defective block, the memory block can be repaired by replacing with a redundant block in block.

4. The semiconductor storage device according to claims 1 or 2, wherein the block selection circuit performs a first logical operation targeted for one or more of the specific partial bits of the selected block address to generate a dummy block address for selecting the dummy block, and when the dummy block address generated by the first logical operation coincides with the defective block address, performs a second logical operation targeted for another one or more of the specific partial bits of the selected block address to generate the dummy block address.

5. The semiconductor storage device according to claim 4, wherein coincidence between the dummy block address and the defective block address is determined by coincidence between the selected block address and the defective block address targeted for address bits except for one or more of the specific partial bits related to the first logical operation.

6. The semiconductor storage device according to claims 1 or 2, wherein the block selection circuit performs a first logical operation targeted for one or more predetermined bits of the specific partial bits of the selected block address, and performs a second logical operation targeted for one or more bits except for the predetermined bits of the specific partial bits of the defective block address, to generate the dummy block address.

7. The semiconductor storage device according to claims 1 or 2, wherein a number of the partial bits is 2.

8. The semiconductor storage device according to claims 1 or 2, wherein the first and second logical operations are inverting operations of address bits.

9. The semiconductor storage device according to claims 1 or 2, wherein a plurality of memory blocks selected by combination of the specific partial bits of a block address to select the memory block are sequentially adjacent to each other to form a sub-memory plane.

10. The semiconductor storage device according to claims 1 or 2, further comprising a reference circuit and a differential input type of sensing circuit, wherein the one global bit line connected to the bit line in the selected memory block is connected to one input of the sensing circuit directly or through a global bit line selection element, the other global bit line connected to the bit line in the dummy block is connected to the other input of the sensing circuit directly or through a global bit line selection element, the reference circuit has a reference memory cell selectively connected to one of the inputs of the sensing circuit or one of the pair of global bit lines, and at the time of a reading operation, the reference memory cell is connected to the input of the sensing circuit for the dummy block.

* * * * *